(12) United States Patent
Abou-Khalil et al.

(10) Patent No.: US 8,575,718 B2
(45) Date of Patent: Nov. 5, 2013

(54) PROGRAMMABLE ELECTRICAL FUSE

(75) Inventors: Michael J. Abou-Khalil, Essex Junction, VT (US); Robert J. Gauthier, Jr., Hinesburg, VT (US); Tom C. Lee, Essex Junction, VT (US); Junjun Li, Williston, VT (US); Souvick Mitra, Burlington, VT (US); Christopher S. Putnam, Hinesburg, VT (US); William Tonti, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/289,529

(22) Filed: Nov. 4, 2011

(65) Prior Publication Data

US 2012/0049321 A1 Mar. 1, 2012

Related U.S. Application Data

(62) Division of application No. 12/135,242, filed on Jun. 9, 2008, now Pat. No. 8,101,505.

(51) Int. Cl.
*H01L 23/52* (2006.01)
*H01L 21/82* (2006.01)

(52) U.S. Cl.
USPC ............... 257/529; 257/E21.592; 438/132; 438/467; 438/601

(58) Field of Classification Search
USPC ........... 257/529, E21.592; 438/132, 467, 601
See application file for complete search history.

(56) References Cited

U.S. PATENT DOCUMENTS

| 5,298,784 | A | 3/1994 | Gambino et al. |
| 5,759,877 | A | 6/1998 | Crafts et al. |
| 6,111,301 | A | 8/2000 | Stamper |
| 6,433,404 | B1 | 8/2002 | Iyer et al. |
| 6,498,385 | B1 | 12/2002 | Daubenspeck et al. |
| 6,555,458 | B1 | 4/2003 | Yu |
| 6,661,330 | B1 | 12/2003 | Young |
| 6,774,457 | B2 | 8/2004 | Appel |
| 7,180,154 | B2 * | 2/2007 | Cho et al. ...................... 257/529 |
| 7,662,674 | B2 | 2/2010 | Maiz et al. |
| 2005/0247995 | A1 | 11/2005 | Pitts et al. |
| 2006/0249808 | A1 | 11/2006 | Hsu et al. |
| 2006/0261437 | A1 * | 11/2006 | Maiz et al. ..................... 257/529 |
| 2007/0170545 | A1 | 7/2007 | Kang et al. |
| 2007/0252238 | A1 * | 11/2007 | Lin ............................... 257/529 |

OTHER PUBLICATIONS

Geppert, L., "Electrical Fuse Lets Chips Heal Themselves" IEEE Spectrum (Oct. 2004) pp. 16-20, vol. 41, No. 10.

* cited by examiner

*Primary Examiner* — Kenneth Parker
*Assistant Examiner* — Jose R Diaz
(74) *Attorney, Agent, or Firm* — Scully, Scott, Murphy & Presser, P.C.; Richard M. Kotulak, Esq.

(57) ABSTRACT

The present invention relates to e-fuse devices, and more particularly to a device and method of forming an e-fuse device, the method comprising providing a first conductive layer connected to a second conductive layer, the first and second conductive layers separated by a barrier layer having a first diffusivity different than a second diffusivity of the first conductive layer. A void is created in the first conductive layer by driving an electrical current through the e-fuse device.

19 Claims, 3 Drawing Sheets

PROGRAMMABLE ELECTRICAL FUSE

CROSS REFERENCE TO RELATED APPLICATION

This application is a divisional of U.S. patent application Ser. No. 12/135,242, filed Jun. 9, 2008 the entire content and disclosure of which is incorporated herein by reference.

FIELD OF THE INVENTION

The present invention relates to a programmable electronic fuse (e-fuse) device, and more particularly to a device and method of programming an e-fuse device by driving an electrical current through a first conductive layer, a barrier layer and a second conductive layer to create a void in the first conductive layer.

BACKGROUND OF THE INVENTION

Computers and related electronic equipment typically have a number of different types of data storage or memory devices. For example, a read only memory (ROM) is a semiconductor memory device in which data is permanently stored. The data stored on ROM cannot be overwritten or otherwise altered by the user. A ROM is also non-volatile, which means that the data is not destroyed when power is lost. A ROM is programmed during its manufacture by making permanent electrical connections in selected memory cells. ROMs are useful wherever unalterable data or instructions are required. A disadvantage of ROMs is that their programming is determined during the design stage and can only be varied by redesigning the chip.

An alternative to a ROM is a programmable read only memory (PROM) which is programmable once after its manufacture. In one type of PROM, each memory cell is provided with an electrical connection in the form of a fusible link. The PROM is programmed by blowing the fusible link in selected cells. To blow the fuse, current is driven through the link. The current heats the link to its melting point and the link is broken. Usually the link breaks in thinner regions where the current density is highest.

Various means have been used in the past to blow electrically blowable fuses. One recently used technique for opening the connection at the fuse employs the electro-migration effect, which has long been identified as a major metal failure mechanism. Electro-migration is the process whereby the ions of a metal conductor move in response to the passage of a high-density current flow though the conductor. Such motion can lead to the formation of voids in the conductor, which can grow to a size where the conductor is unable to pass current. One can take advantage of the electro-migration effect to selectively open up metal connections (e.g., fuses) at desired locations within an integrated circuit.

However, prior art e-fuse devices using electrically parallel layers of silicon and poly-silicon, as well as W-contact structures, are not as desirable because they require high temperature and high power, which causes damage to neighboring elements.

Therefore, there is a need in the art for an e-fuse device featuring a low voltage, low temperature programming process that is less destructive to neighboring devices.

SUMMARY OF THE INVENTION

The present invention relates to e-fuse devices, and more particularly to a structure and method of forming an e-fuse device, the method comprising providing a first conductive layer connected to a second conductive layer, the first and second conductive layers separated by a barrier layer having a first diffusivity different than a second diffusivity of the first conductive layer. A void is created in the first conductive layer by driving an electrical current through the e-fuse device.

Specifically, and in broad terms, an e-fuse device is disclosed, the device comprising:
  a first conductive layer connected to a second conductive layer; and
  a barrier layer between the first and second conductive layers, the barrier layer having a first diffusivity and the first conductive layer having a second diffusivity different than the first diffusivity for creating a void in the first conductive layer in response to an electrical current driven through the e-fuse device.

In a related aspect, the first diffusivity of the barrier layer is lower than the second diffusivity of the first conductive layer.

In a related aspect, the e-fuse device further comprises an insulating layer between the first conductive layer and the second conductive layer.

In a related aspect, the first conductive layer, the barrier layer and the second conductive layer are electrically connected in series by a via formed through the insulating layer.

In a related aspect, the barrier layer is located along a bottom surface and a sidewall surface of the via in a U-shaped configuration.

In a related aspect, the via comprises a spacer adjacent the barrier layer.

In a related aspect, the first conductive layer extends into the via to a point in the insulating layer.

In a related aspect, the first and second conductive layers comprise one of copper, aluminum and aluminum-copper alloy.

In a related aspect, the barrier layer comprises one of tantalum, tantalum nitride, titanium, titanium nitride and tungsten.

In a related aspect, a diffusivity of the second conductive layer is lower than the second diffusivity of the first conductive layer.

Another aspect of the present invention relates to a method of forming an e-fuse, the method comprising:
  providing a first conductive layer connected to a second conductive layer, the first and second conductive layers separated by a barrier layer having a first diffusivity different than a second diffusivity of the first conductive layer; and
  creating a void in the first conductive layer by driving an electrical current through the e-fuse device.

Another aspect of the present invention relates to a method of programming an e-fuse device, the method comprising: driving an electrical current through a first conductive layer, a barrier layer, and a second conductive layer to create a void in the first conductive layer, wherein the barrier layer has a first diffusivity and the first conductive layer has a second diffusivity different than the first diffusivity.

DETAILED DESCRIPTION OF THE INVENTION

Figure 1:
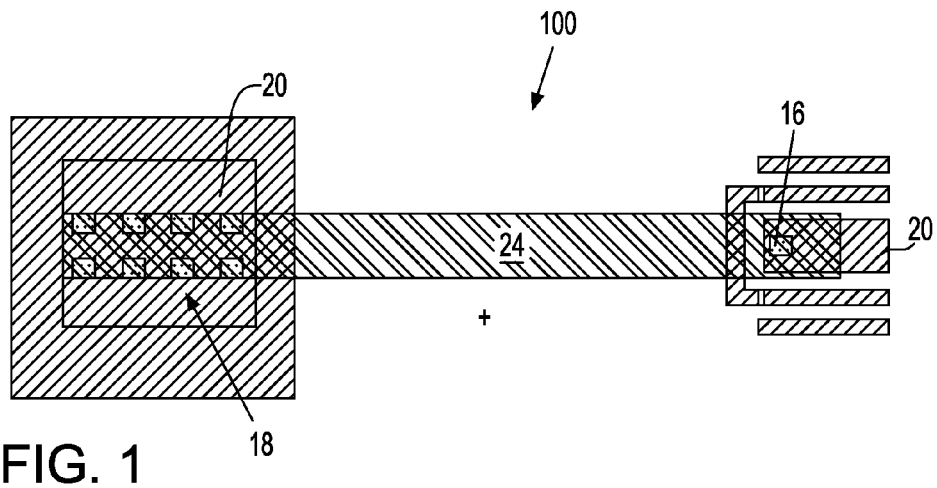
FIG. 1 is a layout top view illustrating a programmable e-fuse device according to an embodiment of the invention.

The present invention, which provides an e-fuse device and a method of programming the e-fuse device, will now be described in greater detail by referring to the drawings that accompany the present application. It is noted that the drawings of the present application are provided for illustrative purposes and are thus not drawn to scale. The figures shown and described illustrate a relatively small portion of a larger semiconductor, which includes associated circuitry not shown. The invention may be understood in the context of a conductive path between elements in a more complex circuit that may be comprised of numerous additional components constructed according to the invention. Moreover, like and corresponding elements shown in the drawings are referred to by like reference numerals.

Figure 2:
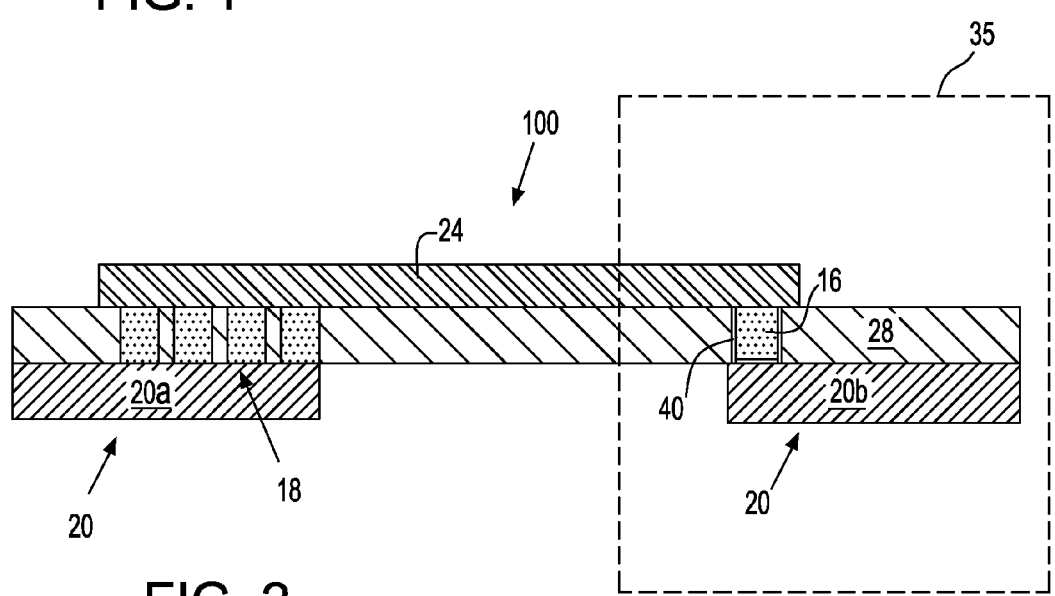
FIG. 2 is a cross sectional view illustrating the programmable e-fuse device of FIG. 1.

Referring first to FIGS. 1-2, an e-fuse device 100 according to the present invention will now be described. As shown, the e-fuse device 100 comprises a first conductive layer 20 electrically connected to a second conductive layer 24. The first and second conductive layers 20, 24 may be formed using deposition processes well known in the art including, but not limited to, chemical vapor deposition (CVD), low pressure CVD (LPCVD), and high-density chemical vapor deposition (HDCVD), physical vapor deposition (PVD), electroplating or a combination thereof. It is assumed for the purposes of describing the examples of the invention herein that the first and second conductive layers 20, 24 may be connected to reference voltage potentials by associated circuitry (not shown) for driving an electrical current through the e-fuse device 100.

The first and second conductive layers 20, 24 are separated by an insulating layer 28 typically composed of a dielectric material such as, but not limited to, crystalline oxide, non-crystalline oxide, porous dielectrics, nitride or any other suitable material formed and patterned to provide a via 16 and a set of vias 18 extending to the first conductive layer 20. The set of vias 18 connects a first section 20a of the first conductive layer 20 to the second conductive layer 24, while the via 16 connects a second section 20b of the first conductive layer 20 to the second conductive layer 24.

Current flows from the first section 20a of the first conductive layer 20 into the second conductive layer 24 through the set of vias 18. Each via in the set of vias 18 provides a separate parallel current path from a voltage reference potential into the second conductive layer 24. All of these parallel current paths converge at the via 16 seeking a return path through the first conductive layer 20 and a barrier layer 40 (to be described in greater detail herein below) positioned between the first and second conductive layers 20, 24. The first conductive layer 20, the barrier layer 40 and the second conductive layer 24 are electrically connected in series by the via 16, which provides the only current path out of the second conductive layer 24. The via 16 and the second conductive layer 24 may be composed of a metal material susceptible to electro-migration, e.g., copper, aluminum or aluminum copper alloy. It will be understood by those with skill in the art that the via 16 and the second conductive layer 24 may comprise the same or different materials and may be formed in a single processing step.

Figure 3:
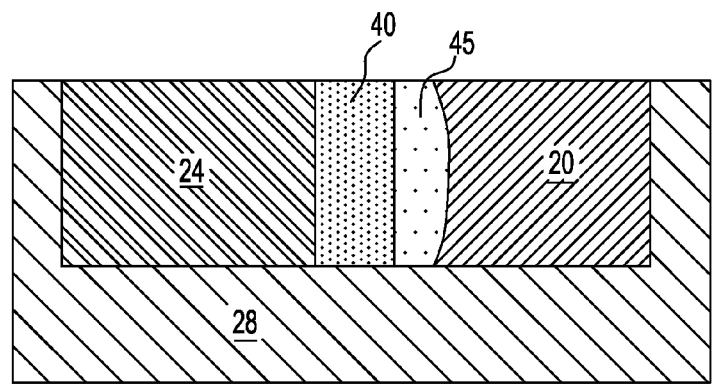
FIG. 3 is a partial cross-sectional view showing formation of a void according to the programming method of the present invention.

Turning now to FIG. 3, a partial cross-sectional view showing formation of a void 45 according to the programming method of the present invention will be described in further detail. As shown, the barrier layer 40 is located between the first and second conductive layers 20, 24. The barrier layer 40 has a first diffusivity, while the first conductive layer 20 has a second diffusivity different than the first diffusivity for creating the void 45 in the first conductive layer 20 in response to an electrical current through the e-fuse device 100. When sufficient programming current is provided, the atoms in the first conductive layer 20 near the barrier layer 40 migrate away from the barrier layer 40, creating an electrical open. Based on this diffusion differential between barrier layer 40 and the first conductive layer 20, the void 45 is created in the first conductive layer 20. It will be understood by those with skill in the art that programming conditions (e.g., voltage, current, temperature, etc.) can be modified as necessary to achieve the desired void 45 size.

The first and second conductive layers 20, 24 may be composed of a metal material susceptible to electro-migration, e.g., copper, aluminum or aluminum copper alloy. It will be understood by those with skill in the art that the first and second conductive layers 20, 24 may comprise the same or different materials. In an exemplary embodiment of the invention, the first and second conductive layers 20, 24 comprise different materials, each having a different diffusivity. The diffusivity of the first conductive layer 20 is higher than the diffusivity of the second conductive layer 24. As such, the material of the first conductive layer 20 is more susceptible to electro-migration than the material of the second conductive layer 20, and the void 45 is formed in the first conductive layer 20 during programming.

The barrier layer 40 is less sensitive to electro-migration and acts as a diffusion block due to its relatively high atomic diffusion resistance as compared to the first and second conductive layers 20, 24. The barrier layer 40 may be comprised of a material such as, but not limited to, tantalum, tantalum nitride, titanium, titanium nitride, tungsten, aluminum and aluminum-copper alloy, or a combination thereof. Preferably, the barrier layer 40 is a tantalum-nitride layer formed by chemisorbing monolayers of a tantalum containing compound and a nitrogen containing compound.

Figure 4A:
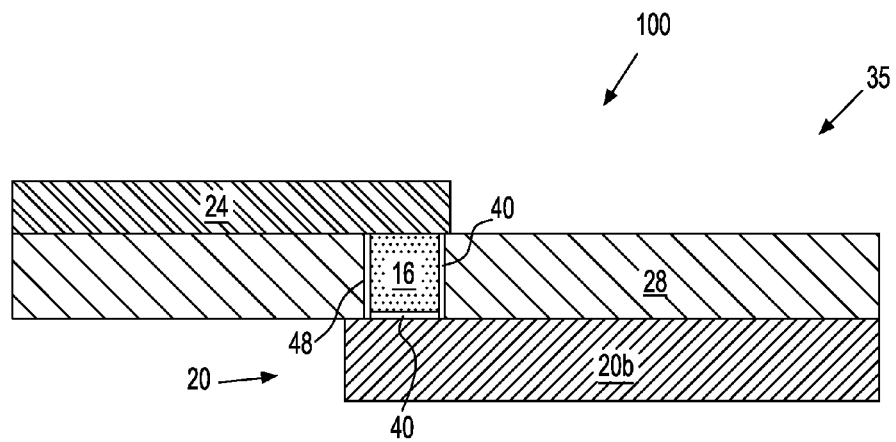
FIG. 4a is a cross sectional view illustrating a portion of the programmable e-fuse device of FIG. 2 before programming.
Figure 4B:
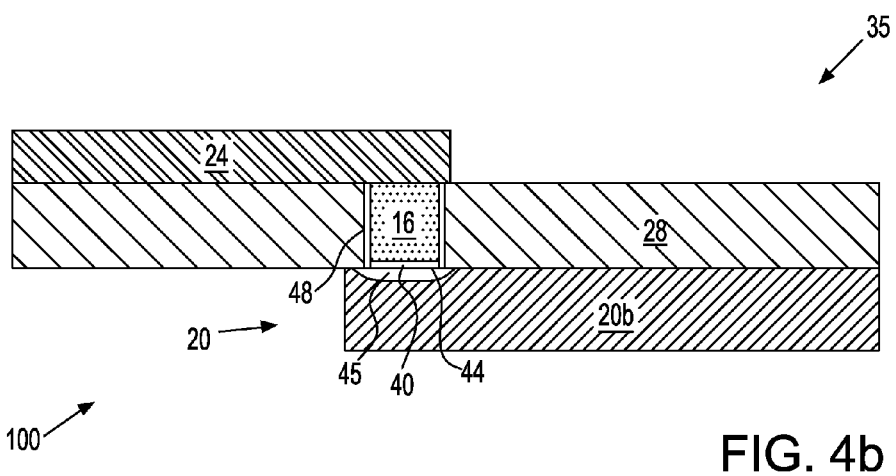
FIG. 4b is a cross sectional view illustrating the portion of the programmable e-fuse device in FIG. 4a after programming.

Referring now to FIGS. 4a-4b, a section 35 of the e-fuse device 100 (represented by dashed line 35 in FIG. 2), including via 16 and the second portion 20b of the first conductive layer 20, will be described in greater detail. As shown, the barrier layer 40 is located between the first and second conductive layers 20, 24 and is formed along the bottom surface 44 and the sidewall surface 48 of via 16 in a U-shaped configuration. The barrier layer 40 has a first diffusivity, while the first conductive layer 20 has a second diffusivity different than the first diffusivity for creating a void 45 (shown in FIG. 4b) in the first conductive layer 20 in response to an electrical current through the e-fuse device 100. As discussed above, the barrier layer 40 is less sensitive to electro-migration and acts as a diffusion block due to its relatively high atomic diffusion resistance as compared to the first and second conductive layers 20, 24. Based on this diffusion differential between barrier layer 40 and the first conductive layer 20, the void 45 is created in the first conductive layer 20 and the resistance of the e-fuse device 100 is significantly increased.

The e-fuse device 100 is particularly useful for metal gate applications having no polysilicon. For example, by providing a tantalum or tantalum nitride barrier layer 40 between copper conductive layers 20 and 24, less current is required to form the void 45 than is required in an e-fuse device having a polysilicon conductive layer. Furthermore, the e-fuse device 100 of the present invention and the choice of materials allows the e-fuse device 100 to be easily incorporated into existing BEOL processes. Therefore, the present invention provides a low-temperature, non-destructive programming process that increases the resistance of the e-fuse device 100, while reducing damage on neighboring elements.

Figure 5A:
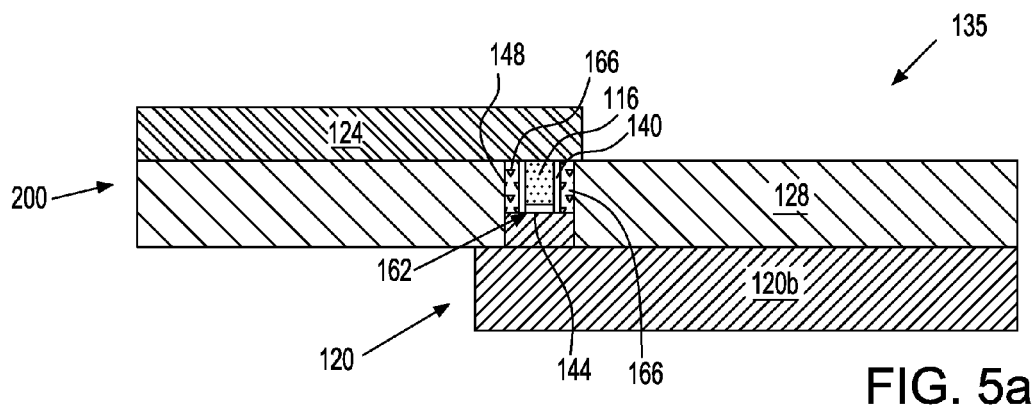
FIG. 5a is a cross sectional view illustrating another embodiment of a programmable e-fuse before programming.
Figure 5B:
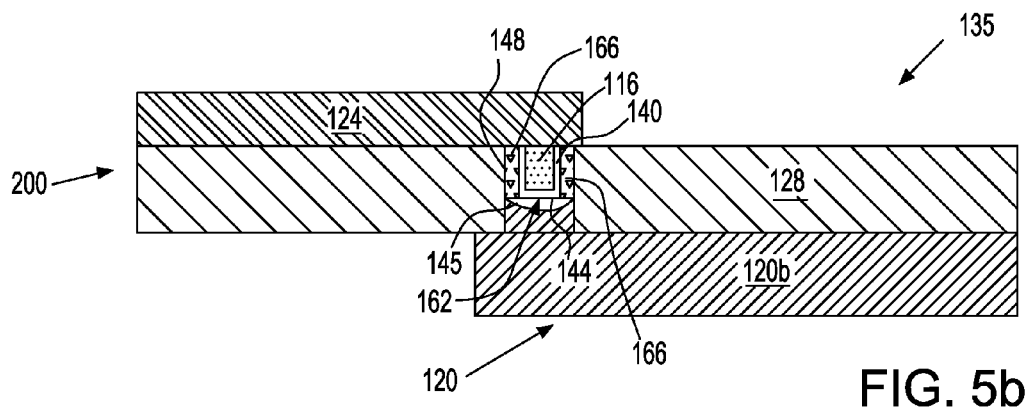
FIG. 5b is a cross sectional view illustrating the programmable e-fuse of FIG. 5a after programming.

Referring now to FIGS. 5a-5b, another embodiment of the invention will be described in more detail. A complete description of features in common with the embodiment shown in FIGS. 1-3 will be dispensed with for the sake of brevity. As shown in FIGS. 5a-5b, the via 116 may comprise a spacer 166 adjacent the barrier layer 140. The spacer 166 may be a dielectric spacer comprised of a material such as, but not limited to, crystalline oxide, non-crystalline oxide, or nitride. The spacer 166 is formed along the sidewall surfaces 148 of the via 116 using conventionally known techniques to define the diameter of the via 116.

Furthermore, the first conductive layer 120 of the e-fuse device 200 extends into the via 116 to a point 162 in the insulating layer 128. The barrier layer 140 has a first diffusivity, while the first conductive layer 120 has a second diffusivity different than the first diffusivity for creating the void 145 in the first conductive layer 120 in the via 116. Based on this diffusion differential between barrier layer 140 and the first conductive layer 120, the void 145 is created in the via 116. Forming the void 145 within the via 116 allows for controlled expansion of the void 145, thus providing greater control over the resistance of the e-fuse device 200.

While the present invention has been particularly shown and described with respect to preferred embodiments thereof, it will be understood by one skilled in the art that the foregoing and other changes in forms and details may be made without departing from the spirit and scope of the invention. It is therefore intended that the present invention is not limited to the exact forms and details described and illustrated, but falls within the spirit and scope of the appended claims.

What we claimed is:

1. An electrical-fuse (e-fuse) device comprising:
   a first section of a first conductive layer and a second section of said first conductive layer that are laterally spaced from each other;
   a second conductive layer vertically separated from said first and second sections of said first conductive layer;
   an insulating layer comprising a dielectric material and located between said first conductive layer and said second conductive layer;
   at least one first via electrically connecting said first section of said first conductive layer and said second conductive layer and including side surfaces that contact said dielectric material of said insulating layer; and
   a combination of a second via and a barrier layer in a U-shaped configuration, said combination electrically connecting said second section of said first conductive layer and said second conductive layer and embedded within said insulating layer, wherein said second via has a same material composition as said at least one first via and is spaced from said dielectric material of said insulating layer by said barrier layer, and said barrier layer comprises a horizontal portion and vertical portions that extend upward from a periphery of said horizontal portion and embeds said second via therein, wherein a bottom surface of said horizontal portion of said barrier layer contacts said second section of said first conductive layer.

2. The e-fuse device of claim 1, wherein said first and second conductive layers comprise one of copper, aluminum and aluminum-copper alloy, and wherein said barrier layer comprises one of tantalum, tantalum nitride, titanium, titanium nitride and tungsten.

3. The e-fuse device of claim 1, wherein said barrier layer has a first diffusivity and said first conductive layer has a second diffusivity different than said first diffusivity.

4. The e-fuse device of the claim 3, wherein said first diffusivity of the barrier layer is lower than said second diffusivity of said first conductive layer.

5. The e-fuse device of claim 3, wherein a diffusivity of said second conductive layer is lower than a second diffusivity of the first conductive layer.

6. The e-fuse device of claim 1, wherein said at least one first via contacts a top surface of said first section of said first conductive layer and a bottom surface of said second conductive layer.

7. The e-fuse device of claim 1, wherein said second via is vertically spaced from said second section of said first conductive layer by said horizontal portion of said barrier layer.

8. The e-fuse device of claim 7, wherein a topmost surface of said second via is in physical contact with a bottom surface of said second conductive layer.

9. The e-fuse device of claim 8, wherein a topmost surface of said vertical portion of said barrier layer contacts said bottom surface of said second conductive layer.

10. The e-fuse device of claim 1, wherein a void embedded within said second section of said first conductive layer is in contact with a bottommost surface of said barrier layer.

11. The e-fuse device of claim 10, wherein said void is located above a horizontal plane including an interface between said insulating layer and a topmost surface of said second section of said first conductive layer.

12. A method of programming an electrical-fuse (e-fuse) device comprising:
    providing an e-fuse device of claim 1; and
    driving an electrical current through said first section of said first conductive layer, said second conductive layer, said second via, said barrier layer, and said second section of said first conductive layer to create a void in said second section of said first conductive layer.

13. The method of claim 12, wherein said e-fuse device further comprises an insulating layer located between said first and second conductive layers.

14. The method of claim 13, wherein said insulating later embeds said at least one first via and said combination.

15. The method of claim 12, wherein a diffusivity of said second conductive layer is lower than a diffusivity of said first conductive layer.

16. The method of claim 12, wherein said void is embedded within said second section of said first conductive layer and contacts a bottommost surface of said barrier layer.

17. The method of claim 16, wherein said void is formed above a horizontal plane including an interface between said insulating layer and said second section of said first conductive layer.

18. An electrical-fuse (e-fuse) device comprising:
    a first section of a first conductive layer and a second section of said first conductive layer that are laterally spaced from each other;
    a second conductive layer vertically separated from said first and second sections of said first conductive layer;
    an insulating layer comprising a dielectric material and located between said first conductive layer and said second conductive layer;

at least one first via comprising a metal material and electrically connecting said first section of said first conductive layer and said second conductive layer;
a combination of a second via, a barrier layer in a U-shaped configuration, and a dielectric spacer laterally contacting, and surrounding, said barrier layer and comprising a different dielectric material than said dielectric material of said insulating layer, said combination electrically connecting said second section of said first conductive layer and said second conductive layer and embedded within said insulating layer, wherein said barrier layer comprises a horizontal portion and vertical portions that extend upward from a periphery of said horizontal portion and embeds said second via therein, wherein a bottom surface of said horizontal portion of said barrier layer contacts said second section of said first conductive layer.

19. An electrical-fuse (e-fuse) device comprising:
a first section of a first conductive layer and a second section of said first conductive layer that are laterally spaced from each other;
a second conductive layer vertically separated from said first and second sections of said first conductive layer;
an insulating layer comprising a dielectric material and located between said first conductive layer and said second conductive layer;
at least one first via comprising a metal material and electrically connecting said first section of said first conductive layer and said second conductive layer;
a combination of a second via and a barrier layer in a U-shaped configuration, said combination electrically connecting said second section of said first conductive layer and said second conductive layer and embedded within said insulating layer, wherein said barrier layer comprises a horizontal portion and vertical portions that extend upward from a periphery of said horizontal portion and embeds said second via therein, wherein a bottom surface of said horizontal portion of said barrier layer contacts said second section of said first conductive layer, wherein an interface between said barrier layer and said second section of said first conductive layer is located above a horizontal interface between said insulating layer and a topmost surface of said second section of said first conductive layer.

* * * * *